United States Patent [19]

Aboaf et al.

[11] Patent Number: 5,001,586
[45] Date of Patent: Mar. 19, 1991

[54] VERY LOW NOISE MAGNETORESISTIVE SENSOR FOR HIGH DENSITY MEDIA APPLICATIONS

[75] Inventors: Joseph A. Aboaf; Vincent N. Kahwaty; James L. Nix, all of Tucson, Ariz.; Frank B. Shelledy, Boulder, Colo.

[73] Assignee: International Business Machines Corporation, Armonk, N.Y.

[21] Appl. No.: 388,241

[22] Filed: Aug. 1, 1989

[51] Int. Cl.$^5$ .............................................. G11B 5/127
[52] U.S. Cl. .................................................... 360/113
[58] Field of Search .......................................... 360/113

[56] References Cited

U.S. PATENT DOCUMENTS

| | | | |
|---|---|---|---|
| 3,848,217 | 11/1974 | Lazzari | 360/113 |
| 3,967,368 | 7/1976 | Brock et al. | 360/113 |
| 4,477,794 | 10/1984 | Nomura et al. | 360/113 |
| 4,782,413 | 11/1988 | Howard et al. | 360/113 |

Primary Examiner—A. J. Heinz
Assistant Examiner—Jefferson Evans
Attorney, Agent, or Firm—Whitham & Marhoefer

[57] ABSTRACT

A soft film biased magnetoresistive sensor (10) is fabricated to have reduced Barkhausen noise. The magnetic ratio of the film layers (14 and 18) is controlled to be in the range of 1.7 to 1.95 and the optimum bias point is controlled to be in the range of 35 and 41 degrees.

28 Claims, 7 Drawing Sheets

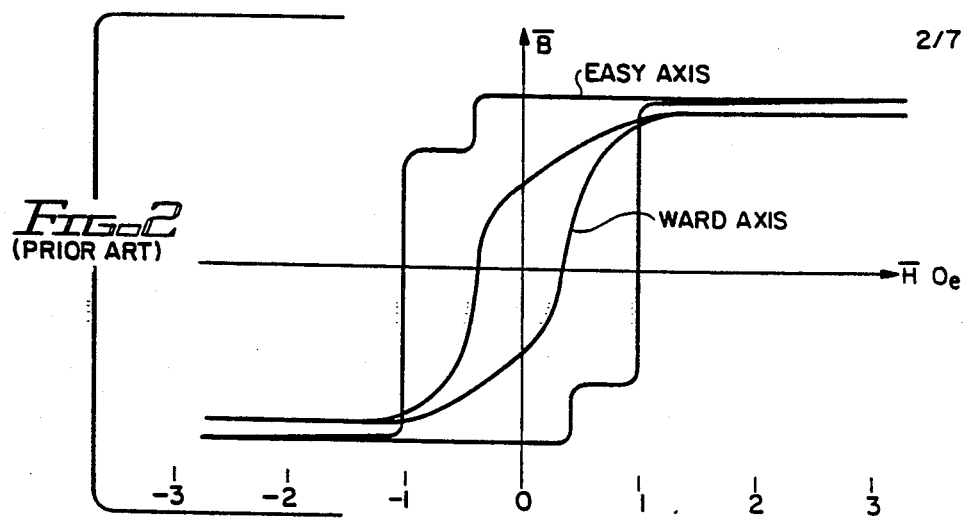
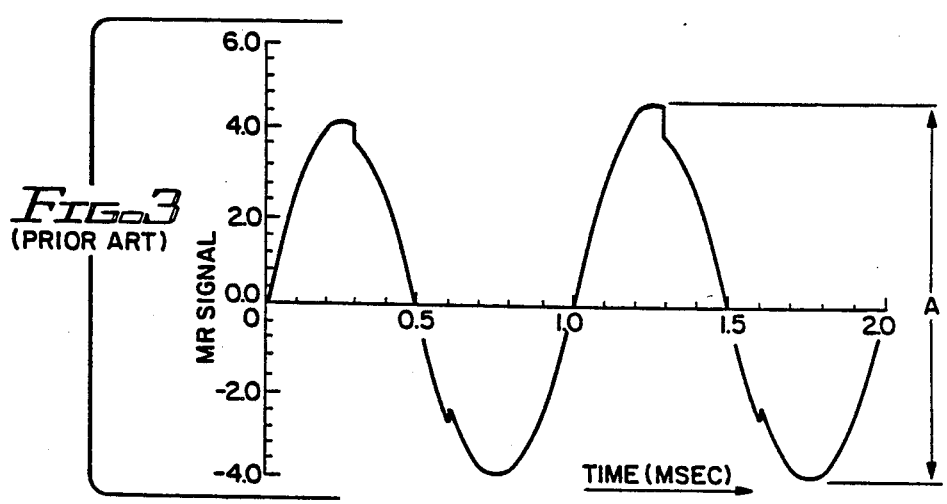
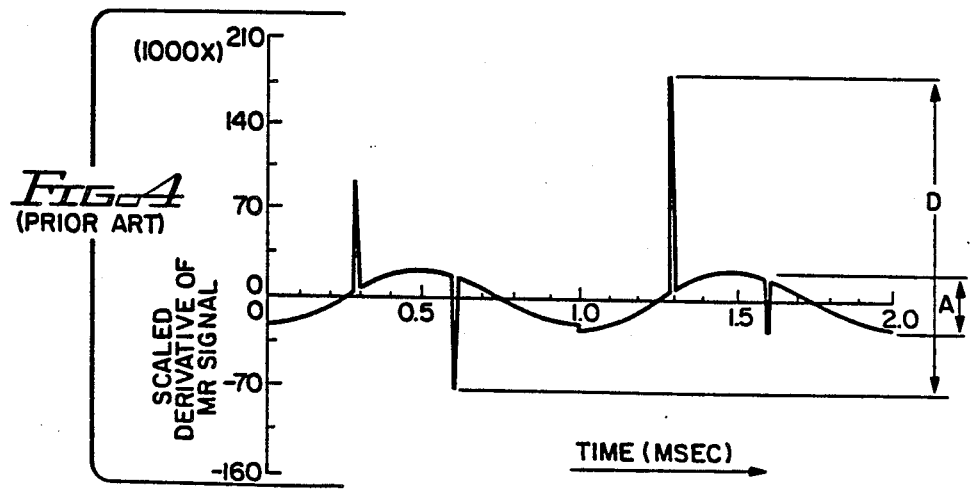

MAXIMUM NORMALIZED DERIVATIVE

MAGNETIC RATIO = 1.58
HIGH MAGNETOSTRICTION: SF = +6.5E-6
(1150 SAMPLES)

FIG.6a  98%↑ MAXIMUM NORMALIZED DERIVATIVE

MAGNETIC RATIO = 1.58
LOW MAGNETOSTRICTION: SF = +1.7E-6
(342 SAMPLES)

FIG.6b  98%↑ MAXIMUM NORMALIZED DERIVATIVE

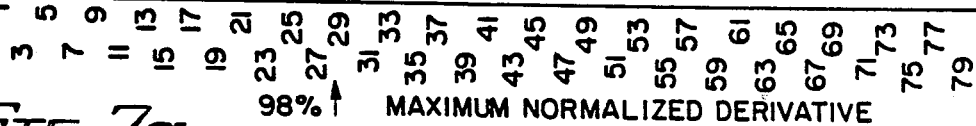
FIG. 7a — MAGNETIC RATIO = 1.58, LOW MAGNETOSTRICTION: SF = 1.7E-6, 396 TRACK SAMPLES. 98% ↑ MAXIMUM NORMALIZED DERIVATIVE
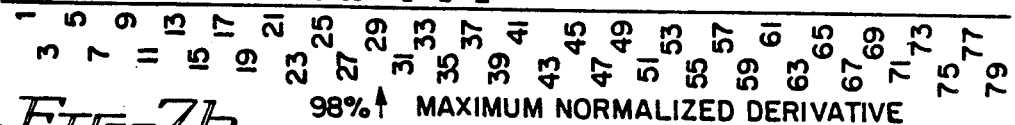
FIG. 7b — MAGNETIC RATIO = 1.58, LOW MAGNETOSTRICTION: SF = 1.7E-6, 342 TRACK SAMPLES. 98% ↑ MAXIMUM NORMALIZED DERIVATIVE

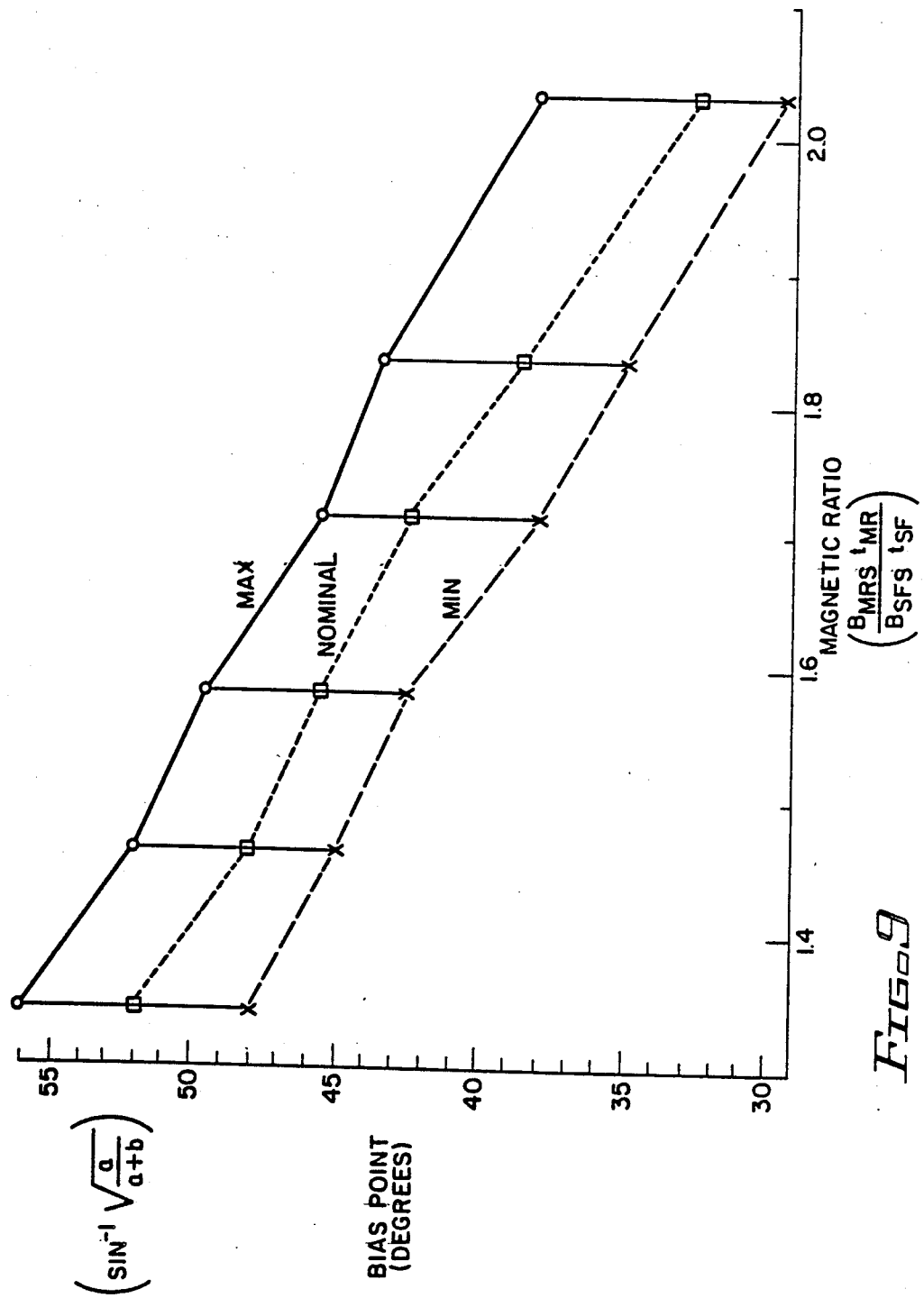

VERY LOW NOISE MAGNETORESISTIVE SENSOR FOR HIGH DENSITY MEDIA APPLICATIONS

BACKGROUND OF THE INVENTION

1. Field of the Invention

The present invention generally relates to soft film biased (SFB) magnetoresistive (MR) sensors used for reading high density magnetic media and, more particularly, to an MR sensor design and fabrication methodology which provides significant Barkhausen noise reduction.

2. Description of the Prior Art

The use of SFB MR sensors to read high density magnetic media is old and well known in the art. SFB MR sensors are comprised of a magnetoresistive film with a soft magnetic film in close proximity thereto, where the magnetoresistive film and the soft magnetic film are separated by an insulative spacer layer. For example, U. S. Pat. No. 4,771,349 to Tsang discloses a magnetoresistive transducer which has a nickel-iron (NiFe or Permalloy ®) magnetoresistive film, a tantalum (TA) spacer, and a nickel-iron-rhodium (NiFeRh) soft magnetic film. Electrodes connected to both ends of the magnetoresistive film allow an electric current to be passed through the magnetoresistive film. Current flow through the magnetoresistive film creates a magnetic field which magnetizes the soft magnetic film. The magnetized soft magnetic film produces a magnetic field which imparts a magnetic bias to the magnetoresistive film; hence, the name "soft film biased magnetoresistive" sensor.

The bias magnetic field serves to improve the sensitivity and linearity of the magnetoresistive effect. When the MR film is biased to its optimum state, the SFB MR sensor can receive a signal magnetic field produced by the recording media (tape or disc) and detect variations in the resistance of the MR film due to the polarity inversion of the signal magnetic field coming from the recording media. It has generally been assumed that a 45° bias produces a bias state in the MR film where the variations of the resistance of the MR film produced by the polarity inversion of the signal magnetic field are symmetric with respect to the magnetic field. The prior art has described the optimum bias angle for SFB MR sensors to be 45° with respect to the easy axis of magnetization of the MR film, and a 45° bias has been associated with the lowest noise production. For example, U.S. Pat. No. 4,803,580 to Mowry discloses that it is old and well known in the art to bias the magnetization vector or current vector to 45° to increase responsiveness to the angular change in the magnetization vector and to linearize sensor output. No studies have reported a relationship between the Barkhausen noise and the bias angle. Therefore, a need exists to establish the optimum bias angle which minimizes Barkhausen noise.

Until recently, the thickness and magnetic characteristics of the magnetoresistive film and soft magnetic film have not been given much consideration. U. S. Pat. No. 4,663,685 to Tsang discloses a magnetoresistive read transducer having a magnetoresistive NiFe film which is 200–500 Angstroms (Å) thick and a soft magnetic NiFeRh film which is 100–500 Å thick. U.S. Pat. No. 4,816,948 to Kamo et.al. discloses a magnetoresistive head where the thickness and magnetic characteristics of the magnetoresistive film and soft magnetic film are controlled. This patent states that the product of the saturated flux density of the soft film bias (SFB) layer and the thickness of the SFB layer is greater than 0.7 times the product of the saturated flux density of the magnetoresistive (MR) layer and the thickness of the MR layer. The relationship dictates that the product of the saturated magnetic flux density of the MR layer and its thickness divided by the product of the saturated magnetic flux density of the SFB layer and its thickness, which is commonly known as the magnetic ratio, shall be less than 1.428. The ratio establishes a 45° bias or operating point for the MR sensor. The magnetostriction requirements necessary to minimize Barkhausen noise in an SFB MR sensor have not been discussed in the prior art.

The prior art suggests the use of a longitudinal field to suppress Barkhausen noise, and considerable effort has been devoted to methods of achieving the longitudinal field. These techniques require additional process steps and utilize space at the active surface of the recording head such that the placement of additional SFB MR sensor elements is constrained. Therefore, a need exists to avoid additional process complexity and to be able to space adjacent MR sensors in close proximity to each other.

The prior art has not addressed the special problems associated with the center-tapped or high density single ended MR sensors and Barkhausen noise suppression. For example, the idea of canted easy axis for MR noise suppression cannot be used with a differential center-tapped configuration.

SUMMARY OF THE INVENTION

It is an object of this invention to provide a method for fabricating an SFB MR sensor with significantly improved Barkhausen noise reduction.

Another object of this invention is to provide an SFB MR sensor that uses the optimum bias point to minimize Barkhausen noise.

Another object of this invention is to provide an SFB MR head design that suppresses Barkhausen noise in a center-tapped or high density single ended configured head.

According to the invention, an extensive experimental investigation has been conducted from which a specific range for the magnetic ratio of the magnetoresistive film compared to the soft magnetic film and a specific bias angle for the SFB MR sensor have been determined to significantly reduce Barkhausen noise in a SFB MR sensor when the sensor is operated at magnetic saturation. The magnetic ratio of films is defined as the product of the thickness of the magnetoresistive film and its saturated magnetic flux density compared to the product of the thickness of the soft magnetic film and its saturated magnetic flux density. The results of the experiments show that the optimum range for the magnetic ratio is approximately between 1.7 to 1.95 with the optimum magnetic ratio being approximately 1.83. The results of the experiments show that the optimum bias angle is about 38° with about a ±4° variation.

The experiments were performed with SFB MR sensors fabricated with a NiFe magnetoresistive film, a non-magnetic Ta spacer, and a NiFeRh soft film (NiFe/Ta/NiFeRh). The films were deposited using standard sputtering techniques where the natural easy axis of magnetization of the SFB MR sensor was aligned with the longitudinal axis of the sensor. Processing was conducted such that the easy axis was not altered by subsequent heating steps. The magnetostriction of the NiFe magnetoresistive film was $0.2*10^{-6}$ and the magnetostriction of the NiFeRh soft magnetic film was $1.7*10^{-6}$.

Best results were obtained with a SFB MR sensor having a magnetic ratio of 1.83 where the NiFe magnetoresistive film was 540 Å thick and the NiFeRh soft film was 360 Å thick. The NiFe saturation magnetization was 10,000 Gauss and the NiFeRh saturation magnetization was 8,200 Gauss. The films are separated by a Ta shunt layer 100 Å thick. The magnetic ratio of 1.83 rather than the absolute thickness of the films is considered to be the relevant parameter.

The experimental results also show that 45° was not the optimum bias angle for the SFB MR sensor, but rather, a bias angle of approximately 38° produced the lowest noise.

BRIEF DESCRIPTION OF THE DRAWINGS

The foregoing and other objects, aspects and advantages of the invention will be better understood from the following detailed description of the preferred embodiments of the invention with reference to the accompanying drawings, in which:

FIG. 2 is a graph of measurements for a trilayer film deposited in a sputtering system with an easy and hard axis measured with a B-H looper;

FIG. 3 is a graph showing the differential SFB MR sensor response to a sine wave magnetic field excitation;

FIG. 4 is a graph of a scaled derivative measurement from FIG. 3;

FIGS. 6a-6b are bar graphs of the maximum normalized derivative of high and low magnetostriction SFB MR sensor samples with the same magnetic ratio;

FIGS. 7a-7b are bar graphs of the response of SFB MR sensors having magnetic ratios of 1.83 and 1.58, respectively;

FIG. 9 is a graph of SFB MR sample results for ranges of the bias point angle versus the magnetic ratio.

DETAILED DESCRIPTION OF THE PREFERRED EMBODIMENT OF THE INVENTION

Figure 1A:
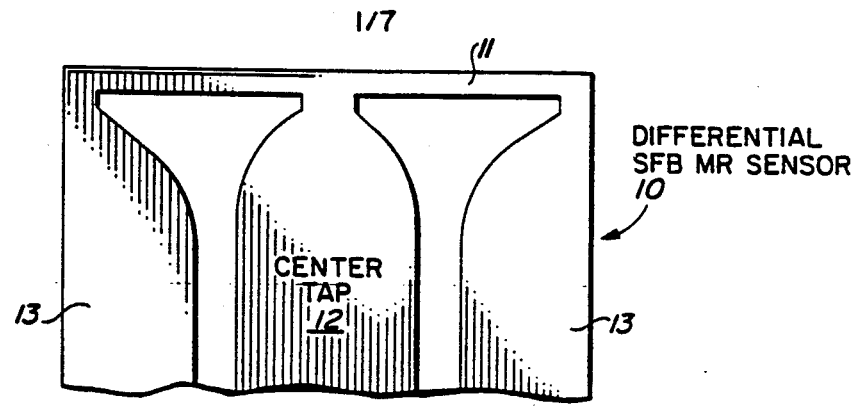
FIGS. 1a-1c are plan, top and isometric views of an SFB MR sensor, respectively.
Figure 1B:
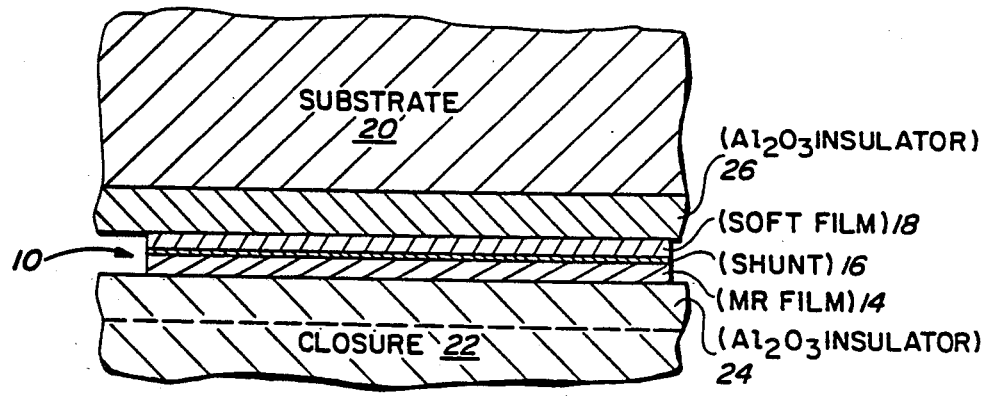
Figure 1C:
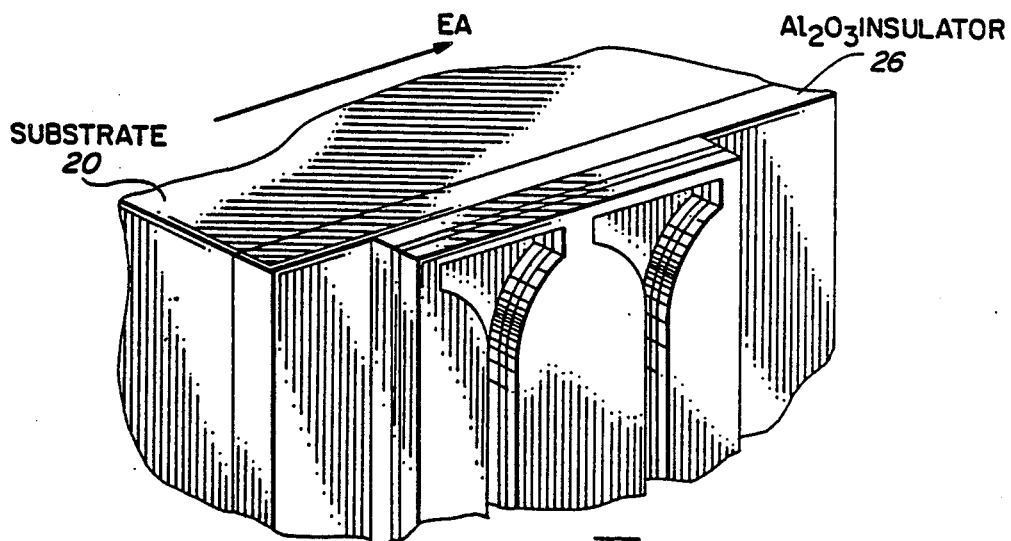
Figure 5A:
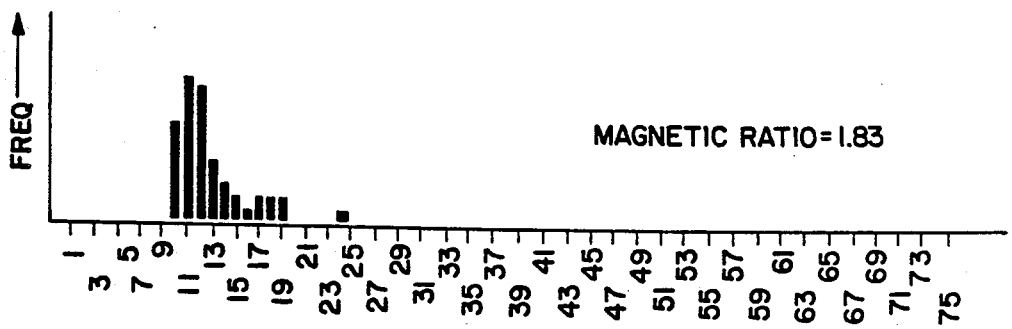
FIGS. 5a-5e are bar graphs of the maximum normalized derivative response of SFB MR sensors having magnetic ratios which vary from 1.34 to 1.83.
Figure 5B:
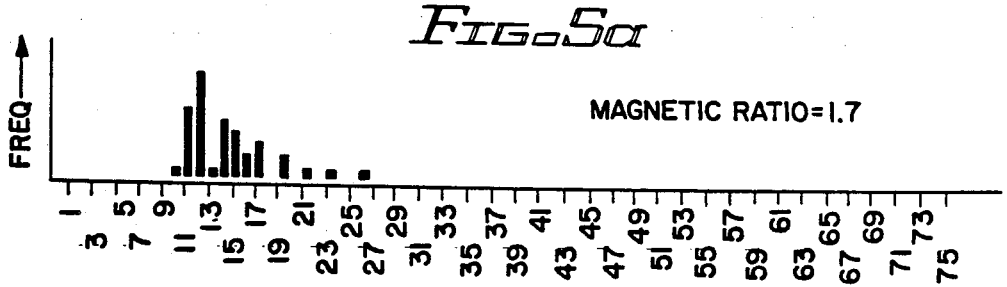
Figure 5C:
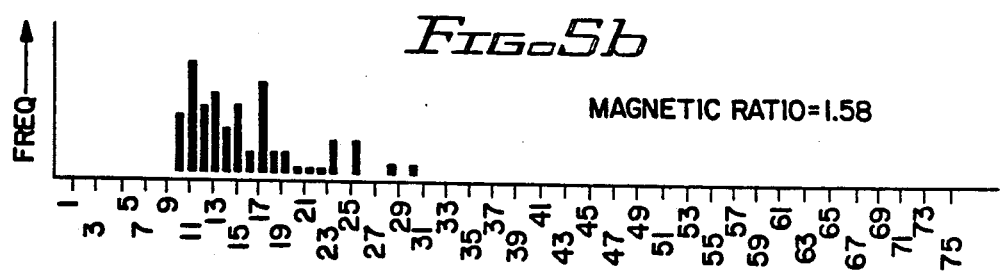
Figure 5D:
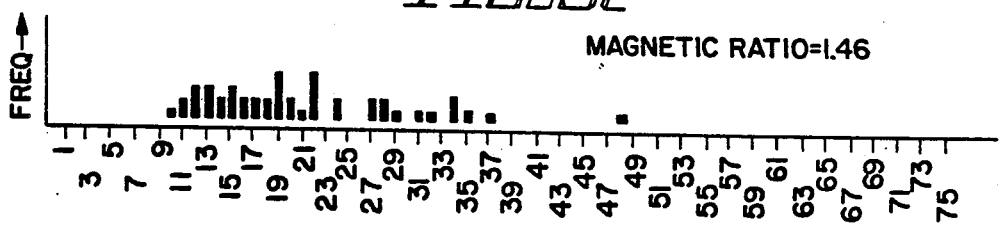
Figure 5E:
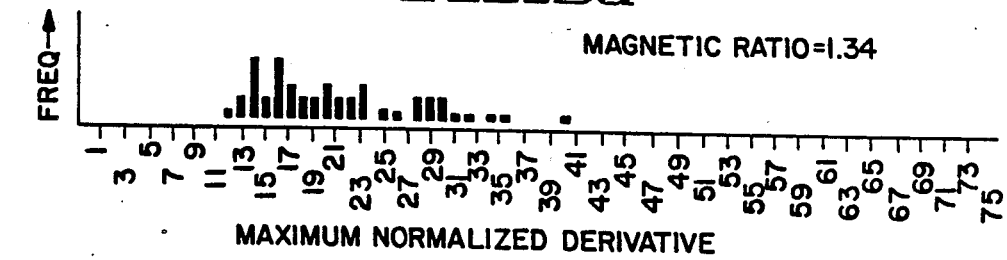

Referring now to the drawings and, more particularly to FIGS. 1a through 1c, a differential SFB MR sensor 10 includes an active MR section 11, a center tapped section 12 and side conductors 13, and includes a trilayer film comprised of the NiFe MR film layer 14, a Ta shunt layer 16, and an NiFeRh soft film bias layer 18. The trilayer film is separated from a substrate 20 and a closure 22 by layers of insulative material 24 and 26 which can be $Al_2O_3$ or any other suitable insulator. The substrate 20 and closure 22 are high permeability magnetic materials of NiZn ferrite, for instance, which form the shield for high resolution tape signal detection. SFB MR sensors constructed as shown in FIGS. 1a through 1c are considered old and well known in the art.

FIG. 2 shows a graph of measurements taken using a B-H looper for a trilayer film constructed as shown in FIGS. 1a through 1c. B-H loopers are commonly available and can be purchased from the SHB corporation or other suppliers. A Kerr tester would yield similar results as a B-H looper. Samples prepared in a sputtering system are taken from the sputtering apparatus and tested in the B-H looper. FIG. 2 indicates the easy axis and hard axis. The magnetic easy axis of the trilayer film was found to be in the radial direction of the pallet on which the wafers were loaded in the sputtering system.

In the preferred embodiment, wafers are loaded on a pallet for further processing in the orientation where the easy axis of the films and longitudinal axis of the future SFB MR sensor are the same. FIG. 1c indicates the easy axis EA on an SFB MR sensor produced according to this procedure. Subsequent processing is conducted such that the easy axis is not altered by the heating steps.

FIG. 3 illustrates the differential SFB MR sensor response from a sine wave external magnetic field excitation of approximately 1000 Hertz (Hz). The excitation of the differential SFB MR sensor is provided by an external coil and field source which can provide either AC or DC excitation fields over a wide range of field magnitudes. FIG. 3 shows the magnetoresistive differential signal resulting from the applied external field which is set to a signal field that is typical of magnetic tape. If the sensor were free of Barkhausen noise, a continuous sine wave would be observed.

Referring to FIG. 4, to characterize discontinuities the derivative of the signal is taken and the peak to peak result D is measured. The peak to peak result is normalized by the amplitude, A, of the initial signal such that a noise free result of the ratio D/A will yield a value of 2 pi (6.28). A value of 2 pi results from using 1 KHz as the exciting frequency and using millivolts (mV) as units for the signal amplitude. By driving the MR sensor with a very high external disturb field (i.e., $\geq 70$ Oersted (Oe)) with the bias current off, a maximum disturbance of the MR sensor is produced. The bias current is then reapplied and the derivative result for various signal levels applied to the sensor under test are measured. The polarity of the disturb field is subsequently reversed and the process is repeated at least twenty-five times.

FIG. 4 shows the peak to peak result D=254 (this number is scaled by a factor of 1000 from a derivative value of 0.254) of a noisy MR sensor having a corresponding normalized derivative of 31 where the peak to peak amplitude, A=8.22 mV, from the initial run shown in FIG. 3, is used for normalizing the peak to peak amplitude as described above. From the above discussion, the lowest noise SFB MR sensors are those with a low valued normalized derivative measurement where 2 pi is the minimum. The noise quality of a track is computed from the maximum derivative value obtained from repeated cycles of the derivative measurement.

Applying the above-described measurement technique to previously processed differential SFB MR sensors, it has been determined that the most favorable magnetostriction for the NiFeRh SFB layer is within $\pm 1.7*10^{-6}$. The corresponding NiFe MR film magnetostriction should be as close to zero as possible (a $0.2*10^{-6}$ magnetostriction for the NiFe film produces very low noise performance).

FIGS. 5a-5e are bar graphs or frequency histograms showing the maximum normalized derivative obtained from the sine wave signal response for each differential SFB MR sensor from a series of twenty-five magnetic destabilizations as previously discussed. The scale on the abscissa is the maximum normalized derivative. The signals shown in FIGS. 5a-5e are obtained using a center-tapped SFB MR sensor with approximately 9 micron stripe height and 190 micron track width. The magnetic ratio was varied from 1.34 to 1.83 and the resulting normalized derivative test performance was measured. The element monitored in FIG. 5a, which has a 1.83 magnetic ratio, had the quietest performance. The expression for the optimum MR:SF magnetic ratio is:

$$\frac{B_{MRS} * T_{MR}}{B_{SFS} * T_{SF}} = 1.83$$

Where $B_{MRS}$ is the saturated magnetic flux density of the MR film and $T_{MR}$ is the MR film thickness. $B_{SFS}$ is the saturated magnetic flux density of soft film and TSF is the soft film thickness. The magnetostriction of the films was $0.2*10^{-6}$ for the NiFe magnetoresistive layer and $6.5*10^{-6}$ for the NiFeRh soft film layer (which is not the lowest noise magnetostriction found earlier). From these results it can be inferred that the high magnetic film thickness ratio of 1.83 allows for fully saturating the unfavorable soft film and prevents significant introduction of noise from this source.

The magnetic ratio of 1.7 shows results similar to the 1.83 ratio and is within the range of the invention. Significant reduction of the magnetic ratio to values shown in FIG. 5c, 5d, and 5e results in a substantial increase in Barkhausen noise in the range of magnetic ratios of 1.58 and lower. In this range of magnetic ratios, the soft film is inadequately biased to assure low Barkhausen noise.

FIG. 6a and 6b show results from SFB MR sensors measured for maximum normalized derivative response. Large sample sizes were used to obtain both sets of results illustrated in FIGS. 6a and 6b. FIG. 6a shows results from prior art SFB MR sensors which had magnetic ratios of 1.58 and a relatively high magnetostriction in the soft film of $6.5*10^{-6}$. FIG. 6b shows results from SFB MR sensors with the same magnetic ratios of 1.58; however, the magnetostriction of the soft film was lower and was equal to $1.7*10^{-6}$. In the high magnetostriction case shown in FIG. 6a, maximum normalized derivative values are obtained in the range of 54 to 77 with a 98 percentile point of about 41. Conversely, the low magnetostriction results shown in FIG. 6b show a maximum derivative jump of 38 with a 98 percentile point of 25 which is a clear improvement over the high magnetostriction film.

FIGS. 7a and 7b show bar graphs or frequency histograms of the maximum normalized derivative results obtained from large sample sizes of SFB MR sensors having ratios of 1.83 and 1.58, respectively, where the sensors all have a preferred low magnetostriction of $1.7*10^{-6}$ for the NiFeRh soft film and $0.2*10^{-6}$ for the NiFe magnetoresistive film. Contrasting the results shown in FIGS. 7a and 7b, the 1.83 magnetic ratio has a maximum normalized derivative value of 23 with a 98 percentile point at less than 17, with the 1.53 magnetic ratio has a maximum normalized derivative value of 38 with a 98 percentile point of 25.

Clearly the stability of the SFB MR sensor is improved with the combination of the 1.83 magnetic ratio as illustrated by the contrasting results of FIGS. 7a and 7b and the preferred low magnetostriction as illustrated by the contrasting results of FIGS. 6a and 6b.

Figure 8A:
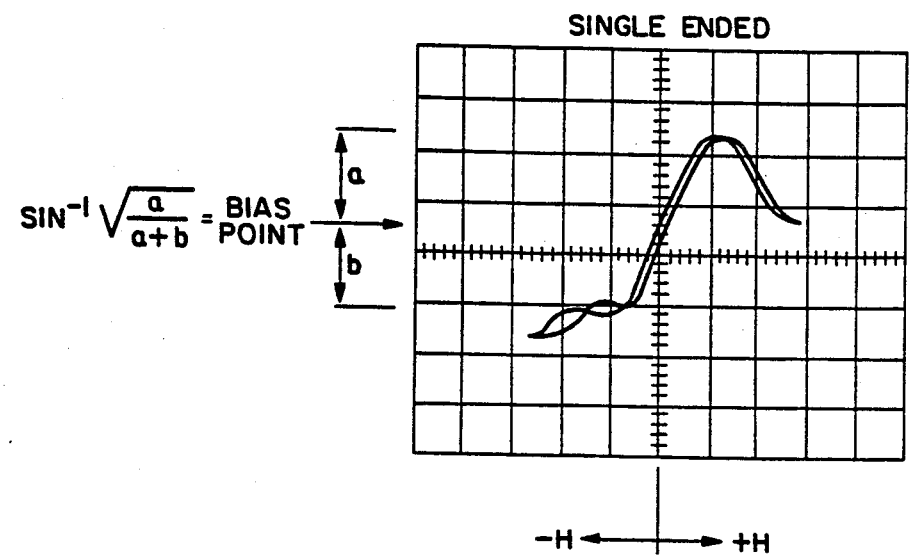
FIGS. 8a-8b are plots of the single ended and differential response signal, respectively, for a SFB MR sensor versus the applied field.
Figure 8B:
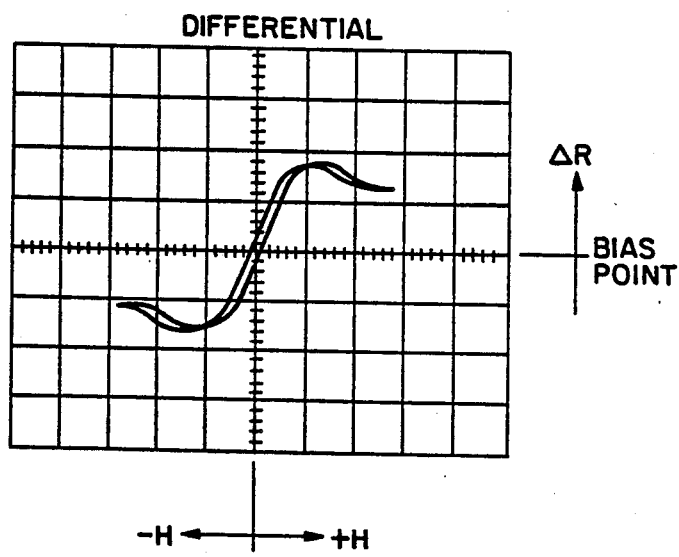

FIG. 8a shows a plot of the single ended signal response of a SFB MR sensor versus the applied field. The bias point is determined by the ratio of the positive response to the total signal response referenced to the response at zero applied field. FIG. 8b shows the differential response of the same SFB MR sensor which will be symmetric while the single ended bias point can vary over a wide range.

FIG. 9 shows the variation of the bias point with magnetic ratios from 1.34 to 2.03. A SFB MR sensor with a 1.58 magnetic ratio provides a nominal 45° bias point while a SFB MR sensor with a 1.83 magnetic ratio provides a nominal 38° bias point with about ±4° of variation. The 38° bias point provides very low noise operation and will produce very low distortion for differential center-tapped operation and for single ended high density operation.

FIG. 9 shows an SFB MR sensor with a 2.04 magnetic ratio produces a nominal bias point of about 31° which will still provide good linearity for most signals. Magnetic ratios to 2.04 and above can be used in applications where the MR sensor will be used in a differential sensing mode or in a single ended configuration where signal amplitude is low which is usually associated with high density recording.

Although a magnetic ratio of about 1.58 will produce about a 45° bias point for maximum large signal linearity, this magnetic ratio and lower values produce inadequate bias to maintain the soft film in adequate saturation to assure low Barkhausen noise.

While the invention has been described in terms of the preferred embodiment where the SFB MR sensor's magnetic ratio is 1.83 and the sensor's nominal bias point is 38°, those skilled in the art will recognize that close approximations, such as magnetic ratios of 1.7-1.95 having nominal bias points of 35-41 degrees, are to be considered within the spirit and scope of the appended claims. Further, the materials used for the different layers in the tape head and the overall configuration of the tape head should not be considered limiting.

Having thus described our invention what we claim as novel and desire to secure by Letters Patent is the following:

1. In a soft film biased magnetoresistive sensor with reduced Barkhausen noise, comprising a magnetoresistive film having a first saturated magnetic flux density for said magnetoresistive film and first film thickness for said magnetoresistive film, and a magnetically soft film positioned in close proximity to said magnetoresistive film and spaced therefrom by a non-magnetic shunt layer, said magnetically soft film having a second saturated magnetic flux density for said magnetically soft film and a second film thickness for said magnetically soft film, the improvement wherein a magnetic ratio of a first product of said first saturated magnetic flux density and said first film thickness to a second product of said second saturated magnetic flux density and said second film thickness is substantially in the range of about 1.7 to 1.95, said magnetic ratio corresponding to a nominal bias point substantially in a range of about 35 to 41 degrees, respectively.

2. A soft film biased magnetoresistive sensor as recited in claim 1 wherein said magnetic ratio is substantially 1.83, said magnetic ratio corresponding to a nominal bias point of substantially 38.

3. A soft film biased magnetoresistive sensor as recited in claim 1 wherein said magnetoresistive film is comprised of a nickel-iron alloy and said magnetically soft film is comprised of a nickel-iron-rhodium alloy.

4. A soft film biased magnetoresistive sensor as recited in claim 3 wherein said non-magnetic shunt layer is comprised of tantalum.

5. A soft film biased magnetoresistive sensor as recited in claim 3 wherein the magnetostriction of said nickel-iron alloy is less than substantially $0.2*10^{-6}$ and the magnetostriction of said nickel-iron-rhodium alloy is less than substantially $1.7*10^{-6}$.

6. A soft film biased magnetoresistive sensor as recited in claim 1 wherein said magnetically soft film has a magnetostriction less than substantially $1.7*10^{-6}$.

7. A soft film biased magnetoresistive sensor as recited in claim 1 wherein said magnetoresistive sensor is a center-tapped magnetoresistive sensor.

8. In a soft film biased magnetoresistive sensor with reduced Barkhausen noise, comprising a magnetoresistive film having a first saturated magnetic flux density for said magnetoresistive film and a first film thickness for said magnetoresistive film, and a magnetically soft film positioned in close proximity to said magnetoresistive film, said magnetically soft film having a second saturated magnetic flux density for said magnetically soft film and a second film thickness for said magnetically soft film, the improvement wherein a magnetic ratio of a first produce of said first saturated magnetic flux density and said first film thickness to a second product of said second saturated magnetic flux density and said second film thickness is substantially in the range of about 1.7 to 1.95.

9. A soft film biased magnetoresistive sensor as recited in claim 8 wherein said magnetic ratio is substantially 1.83.

10. A soft film biased magnetoresistive sensor as recited in claim 8 wherein said magnetoresistive film is comprised of a nickel-iron alloy and said magnetically soft film is comprised of a nickel-iron-rhodium alloy.

11. A soft film biased magnetoresistive sensor as recited in claim 10 wherein the magnetostriction of said nickel-iron alloy is less than substantially $0.2*10^{-6}$ and the magnetostriction of said nickel-iron-rhodium alloy is less than substantially $1.7*10^{-6}$.

12. A soft film biased magnetoresistive sensor as defined in claim 8 further including a non-magnetic shunt layer placed between said magnetoresistive film and said magnetically soft film.

13. A soft film biased magnetoresistive sensor as recited in claim 12 wherein said non-magnetic shunt layer is comprised of tantalum.

14. A soft film biased magnetoresistive sensor as recited in claim 8 wherein said magnetically soft film has a magnetostriction less than substantially $1.7*10^{-6}$.

15. A soft film biased magnetoresistive sensor as recited in claim 8 wherein said magnetoresistive sensor is a center-tapped magnetoresistive sensor.

16. A soft film biased magnetoresistive sensor as defined in claim 8 wherein said magnetically soft film provides a nominal bias point of between 35 and 41 degrees.

17. A soft film biased magnetoresistive sensor as defined in claim 16 wherein said nominal bias point is 38 degrees.

18. A soft film biased magnetoresistive sensor as defined in claim 17 wherein said nominal bias point is 38 degrees and has a $\pm 4$ degree variation.

19. A soft film biased magnetoresistive sensor with reduced Barkhausen noise comprising a magnetoresistive film having a first saturated magnetic flux density for said magnetoresistive film and a first film thickness for said magnetoresistive film, and a magnetically soft film positioned in close proximity to said magnetoresistive film, said magnetically soft film having a second saturated magnetic flux density for said magnetically soft film and a second film thickness for said magnetically soft film and providing a nominal bias point substantially in the range of about 35 to 41 degrees.

20. A soft film biased magnetoresistive sensor as recited in claim 19 wherein said nominal bias point is approximately 38.

21. A soft film biased magnetoresistive sensor as recited in claim 19 wherein said magnetoresistive film is comprised of a nickel-iron alloy and said magnetically soft film is comprised of a nickel-iron-rhodium alloy.

22. A soft film biased magnetoresistive sensor as recited in claim 21 wherein the magnetostriction of said nickel-iron alloy is less than substantially $0.2*10^{-6}$ and the magnetostriction of said nickel-iron-rhodium alloy is less than substantially pb $1.7*10^{-6}$.

23. A soft film biased magnetoresistive sensor as defined in claim 19 further including a non-magnetic shunt layer placed between said magnetoresistive film and said magnetically soft film.

24. A soft film biased magnetoresistive sensor as recited in claim 23 wherein said non-magnetic shunt layer is comprised of tantalum.

25. A soft film biased magnetoresistive sensor as recited in claim 19 wherein said magnetically soft film has a magnetostriction less than substantially $1.7*10^{-6}$.

26. A soft film biased magnetoresistive sensor as recited in claim 19 wherein said magnetoresistive sensor is a center-tapped magnetoresistive sensor.

27. A soft film biased magnetoresistive sensor as described in claim 19 wherein a magnetic ratio of a first product of said first saturated magnetic flux density and said first film thickness to a second product of said second saturated magnetic flux density and said second film thickness is substantially in the range of about 1.7 to 1.95.

28. A soft film biased magnetoresistive sensor as recited in claim 27 wherein said magnetic ratio is substantially 1.83.

* * * * *